United States Patent
Kung et al.

(10) Patent No.: US 6,179,200 B1
(45) Date of Patent: Jan. 30, 2001

(54) METHOD FOR FORMING SOLDER BUMPS OF IMPROVED HEIGHT AND DEVICES FORMED

(75) Inventors: Ling-Chen Kung; Hsu-Tien Hu; Ruoh-Huey Uang; Szu-Wei Lu; Chun-Yi Kuo, all of Hsinchu (TW)

(73) Assignee: Industrial Technology Research Institute, Hsin Chu (TW)

( * ) Notice: Under 35 U.S.C. 154(b), the term of this patent shall be extended for 0 days.

(21) Appl. No.: 09/243,031

(22) Filed: Feb. 3, 1999

(51) Int. Cl.[7] .......................... B23K 35/12; B23K 31/02; B23K 31/00; B21D 39/00
(52) U.S. Cl. ................... 228/254; 228/174; 228/180.22; 228/248.1
(58) Field of Search ................ 228/254, 248.1, 228/174, 180.22

(56) References Cited

U.S. PATENT DOCUMENTS

| | | | |
|---|---|---|---|
| 5,493,075 | * | 2/1996 | Chong et al. ............... 174/261 |
| 5,535,936 | * | 7/1996 | Chong et al. ............... 228/175 |
| 5,607,099 | * | 3/1997 | Yeh et al. ............... 228/180.22 |
| 5,658,827 | * | 8/1997 | Aulicino et al. ............... 228/180.22 |
| 5,775,569 | * | 7/1998 | Berger et al. ............... 228/254 |
| 5,791,552 | * | 8/1998 | Werther ............... 228/248.1 |
| 5,825,629 | * | 10/1998 | Hoebener et al. ............... 361/777 |

* cited by examiner

*Primary Examiner*—Patrick Ryan
*Assistant Examiner*—Zidia T. Pittman
(74) *Attorney, Agent, or Firm*—Tung & Associates

(57) ABSTRACT

A method for forming solder balls that have improved height on an electronic substrate such as a silicon wafer and devices formed are disclosed. In the method, after solder bumps are deposited by a conventional method such as evaporation, electroplating, electroless plating or solder paste screen printing, the solder bumps are reflown on the substrate in an upside down position such that the gravity of the solder material pulls down the solder ball and thereby increasing its height after the reflow process is completed. It has been found that a minimum of 5%, and preferably about 10% height increase has been achieved. Another benefit achieved by the present invention novel method which is associated with the increase in the solder ball height is a corresponding increase in the pitch distance between the solder balls by at least 5%.

18 Claims, 4 Drawing Sheets

METHOD FOR FORMING SOLDER BUMPS OF IMPROVED HEIGHT AND DEVICES FORMED

FIELD OF THE INVENTION

The present invention generally relates to a method for forming solder bumps on an electronic substrate and more particularly, relates to a method for forming solder bumps of improved height on a silicon wafer by reflowing the solder bumps into solder balls in a furnace with the bumps placed in an upside down position.

BACKGROUND OF THE INVENTION

In modern semiconductor devices, the ever increasing device density and decreasing device dimensions demand more stringent requirements in the packaging and interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die for the subsequent connection to an outside circuit. When bonding a flip-chip, the IC die is turned upside down and connected to an electronic substrate by reflowing the solder bumps provided on area-array metal terminals on the die to corresponding solder-wettable terminals on the substrate. The flip-chip attachment method offers numerous processing advantages and desirable properties obtained, for instance, the flip-chip interconnects are self-aligning during an IC die/substrate joining, a low lead inductance based on short interconnection lengths, a reduced need for precious metals, a high productivity and a thermal conduction path between the die and the substrate.

A flip-chip bond pad structure consists of multiple thin layers deposited on the bond pads with ball limiting metallurgy (BLM) and solder bumps formed on the BLM layers. The BLM layers are usually multi-layered with an adhesive layer of 0.1 $\mu$m thick, a barrier layer of 1 $\mu$m thick and a bonding layer of 0.3 $\mu$m thick. The solder bumps formed on top of the BLM layers may have diameters ranging between 100 $\mu$m and 250 $\mu$m and a height ranging between 50 $\mu$m and 200 $\mu$m. In the BLM layers, chromium and titanium are commonly used adhesion layer metals, copper, palladium, platinum, nickel are commonly used as barrier layer metals, and gold is commonly used as the bonding layer metal. The solder bump is typically formed of a high-lead content solder that has a high melting temperature.

In fabricating a flip-chip bond structure, the fabrication process requires a tight control of interface processes and manufacturing parameters in order to meet very small dimensional tolerances. Various techniques may be utilized to fabricate a BLM structure and to deposit the solder bump which include evaporation, electroplating, electroless plating and screen printing.

The formation of solder bumps can be carried out by an evaporation method of Pb and Sn through a mask for producing the desired solder bumps. When a metal mask is used, BLM metals and solder materials can be evaporated through designated openings in the metal mask and be deposited as an array of pads onto the chip surface. A typical evaporation process is shown in FIG. 1.

Referring now to FIG. 1, wherein a wafer is first passivated with an insulating layer, via holes are then etched through the wafer passivation layer which is normally $SiO_2$ to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is then evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final BLM layer of pure copper which forms the solderable metallurgy. A thin layer of gold may optionally be evaporated to provide an oxidation protection layer. These metal-layered pads define the solder wettable regions on the chips which are commonly referred to as the ball limiting metallurgy (BLM). After the completion of BLM, solder evaporation occurs through a metal mask which has a hole diameter slightly greater than the BLM mask-hole diameter. This provides the necessary volume for forming a subsequent solder ball. A solder reflow process is performed at a temperature of about 350° C. to melt and homogenize the evaporated metal pads and to impart a truncated spherical shape to the solder bump. The evaporation method, even though well established and has been practiced for a long time in the industry, is a slow process and thus can not be run at high throughput rate.

A second method for forming solder bumps, the electroplating technique is shown in FIG. 2. In an electroplating process, BLM layers are first deposited, followed by the deposition of a photoresist layer, the patterning of the photoresist layer, and then the electro-deposition of a solder material into the photoresist openings. After the electro-deposition process is completed, the photoresist layer can be removed and the BLM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over a hole wafer area and etching metal layers on the wafer without damaging the plated solder layer. The technique of electroless plating may also be used to form BLM structure.

One other solder bump formation technique that is capable of solder-bumping a variety of substrates is a solder paste screening technique shown in FIG. 3. The screen printing technique can be used to cover the entire area of an 8 inch wafer. In the method, a wafer surface covered by a passivation layer with bond pads exposed is first provided. BLM layers are then deposited on top of the bond pads and the passivation layer. After the coating of a photoresist layer and the patterning of the layer, the BLM layers are etched followed by stripping off the photoresist layer. A stencil is then aligned on the wafer and a solder paste is squeegeed through the stencil to fill the openings on top of the bond pads and the BLM layers. After the stencil is removed, the solder bumps may be reflowed in a furnace to form solder balls.

One drawback of the solder paste screen printing process is that, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself. A paste is generally composed of a flux and solder alloy particles. The consistency and uniformity of the solder paste composition becomes more difficult to control with a decreasing solder bump volume. A possible solution for this problem is the utilization of solder paste that contain extremely small and uniform solder particles. However, this can only be achieved at a very high cost penalty. Another problem in using the solder paste screening technique in modern high density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

In practicing the flip-chip bonding technology, it has also been found that the fatigue life of the solder ball joint is directly proportional to the height of the solder bumps (or solder balls after reflow). It is therefore desirable to increase the height of the solder balls during the fabrication process of the solder bumps and during the reflow process for the solder balls. Such increase in the height of the solder balls directly increases the fatigue life of a solder ball joint established between a flip-chip and a substrate. In the three techniques discussed above for fabricating the solder bumps, i.e., the evaporation method, the electroplating method and the screen printing method, the final fabrication step is always a reflow process for the solder bumps wherein a wafer is placed in a nitrogen furnace for heating the solder bumps to a reflow temperature which is normally the melting temperature of the solder material that forms the bumps. The wafers are normally placed in the reflow furnace facing up and thus, during the reflow or the melting of the solder bumps, even though the internal force in the bumps tend to draw the balls in a spherical shape, the internal force must balance with the gravity of the solder material and thus, a short or flattened spherical ball of the solder is normally formed. This is shown in FIG. 4. The short or flattened solder balls not only result in a shorter fatigue life, but also result in a small pitch between the balls. When a wafer carrier or transport belt is slightly tilted, the flattened solder balls in a molten state may easily touch each other and cause a short circuit in the IC die.

It is therefore an object of the present invention to provide a method for forming solder balls that does not have the drawbacks or shortcomings of the conventional methods for forming solder balls.

It is another object of the present invention to provide a method for forming solder balls that have improved height on an electronic substrate.

It is a further object of the present invention to provide a method for forming solder balls that have improved height such that the pitch between the balls may be increased.

It is another further object of the present invention to provide a method for forming solder balls by reflowing solder bumps formed on a substrate surface in an upside down position.

It is still another object of the present invention to provide a method for forming solder balls of improved height on a silicon wafer by reflowing solder bumps formed on the wafer in an upside down position such that the gravity of the solder balls improves the height of the balls during the reflow process.

It is yet another object of the present invention to provide a method for forming solder balls of improved height on a silicon wafer by heating solder bumps formed on the wafer in an upside down position at a temperature of at least the melting temperature of the solder material.

It is still another further object of the present invention to provide an electronic substrate that has solder balls of improved height formed thereon wherein a multiplicity of upwardly standing solder balls are formed each having a height that is increased by at least 10%.

It is yet another further object of the present invention to provide an electronic substrate that has solder balls of improved height formed on a top surface of the substrate wherein the solder balls of improved height have a pitch that is increased by at least 10%.

SUMMARY OF THE INVENTION

In accordance with the present invention, a method for forming solder balls of improved height on an electronic substrate such as a silicon wafer and devices formed by such method are provided.

In a preferred embodiment, a method for forming solder balls of improved height on a silicon wafer can be carried out by the operating steps of providing an electronic substrate which has a multiplicity of conductive pads on a top surface, patterning a photomask overlying the substrate for providing a multiplicity of openings exposing the multiplicity of conductive pads, filling the multiplicity of openings to expose the multiplicity of conductive pads, filling the multiplicity of openings with a solder material, removing the photomask from the substrate forming the multiplicity of upwardly standing solder bumps on the top surface, turning the electronic substrate upside down such that the multiplicity of upwardly standing solder bumps are pointed downwardly, and heating the multiplicity of solder bumps at a temperature at least the reflow temperature of the solder material for a sufficient length of time such that the solder bumps are reflown into solder balls.

The method for forming solder balls of improved height on an electronic substrate may further include the step of filling the multiplicity of openings with a solder material by a technique selected from evaporation, electroplating, electroless plating or screen printing. The method may further include the step of filling the multiplicity of openings with a Pb/Sn solder material. The method may further include the step of filling the multiplicity of openings with a solder material that contains between about 37% and about 97% Pb and between about 3% and about 63% Sn. The electronic substrate may be a silicon wafer. The method may further include the step of filling the multiplicity of openings with a solder material that has a melting temperature of not less than 180° C.

The method for forming solder balls of improved height on an electronic substrate may further include the step of positioning the electronic substrate on a carrier such that the multiplicity of solder bumps are spaced apart from the carrier after the step of turning the electronic substrate upside down. The reflow temperature of the solder material is at least 150° C. The sufficient length of time for heating the multiplicity of solder bumps is at least 1 minute. A height of the solder balls after a reflow process is improved by at least 10%. The solder bumps of improved height are formed with an increase in the pitch by at least 5%. The solder bumps of improved height may be formed on a flip-chip.

The present invention is further directed to an electronic substrate which has solder balls of improved height formed thereon including an electronic substrate which has a multiplicity of conductive elements on a top surface, and a multiplicity of upwardly standing solder balls in electrical communication with the multiplicity of conductive elements wherein each of the multiplicity of solder balls has a height that is increased by at least 10%.

The electronic substrate which has solder balls of improved height formed thereon may be a silicon wafer. The solder balls of improved height may have a pitch that is increased by at least 10%. The solder balls may be formed of a lead/tin solder material which has a melting temperature of at least 180° C. The solder balls may be formed of a solder material containing between about 37% and about 97% Pb, and between about 3% and about 63% Sn.

The present invention is further directed to a method for forming solder bumps of improved height on a flip-chip which includes the steps of providing a silicon substrate which has a multiplicity of flip-chips formed on top, each of the flip-chips further include a multiplicity of conductive pads on a top surface, depositing a photomask overlying the silicon wafer for providing a multiplicity of openings exposing the multiplicity of conductive pads, filling the multiplicity of openings with a solder material, removing the photomask from the silicon wafer to form the multiplicity of upwardly standing solder bumps on the top surface, turning the silicon wafer upside down such that the multiplicity of upwardly standing solder bumps are pointed downwardly, and heating the multiplicity of solder bumps at a temperature of at least the reflow temperature of the solder material for a sufficient length of time such that the solder bumps are reflown into solder balls of improved height.

The method for forming solder balls of improved height on a flip-chip may further include the step of filling the multiplicity of openings with a solder material by a technique selected from the group consisting of evaporation, electroplating, electroless plating and screen printing. The solder material used may be a Pb/Sn based material. The method may further include the step of turning the silicon wafer upside down and positioning the silicon wafer on a carrier frame such that the solder bumps are spaced apart from a bottom surface of the carrier frame. The method may further include the step of heating the multiplicity of solder bumps at a reflow temperature of at least 150° C.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention discloses a method for forming solder balls of improved height on an electronic substrate such as a silicon wafer and devices formed by such method.

In the present invention method, solder bumps may first be deposited on top of an electronic substrate such as a silicon wafer by any one of suitable methods such as evaporation, electroplating, electroless plating or solder paste screen printing. The solder bumps are normally deposited into openings either in a patterned photoresist layer or in a metal stencil that has openings exposing conductive bonding pads provided on the substrate. Prior to the deposition of the solder material, the bonding pads may first be prepared by the deposition of multi-layers of BLM material to improve adhesion and to provide a barrier layer for migration. Each one of the deposition methods has its advantages and disadvantages such as the minimal size of bumps that may be formed, the processing time necessary and the cost of the deposition process. A stringent dimensional control is another important factor in building solder bumps for modern high density devices.

Figure 1:
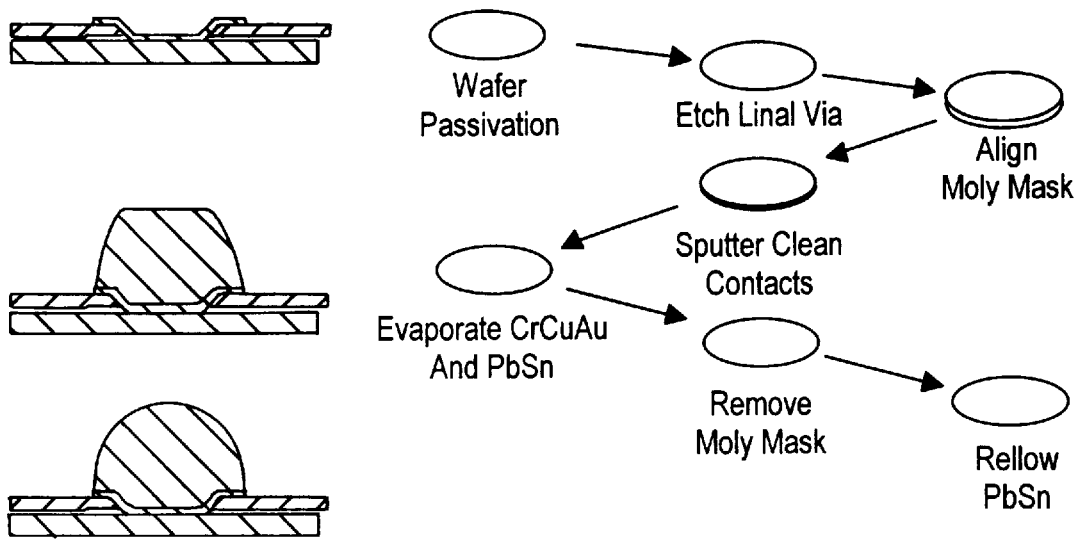
FIG. 1 is a graph illustrating a process flow chart and corresponding enlarged, cross-sectional views of solder bumps being formed on a bond pad by an evaporation method.
Figure 2:
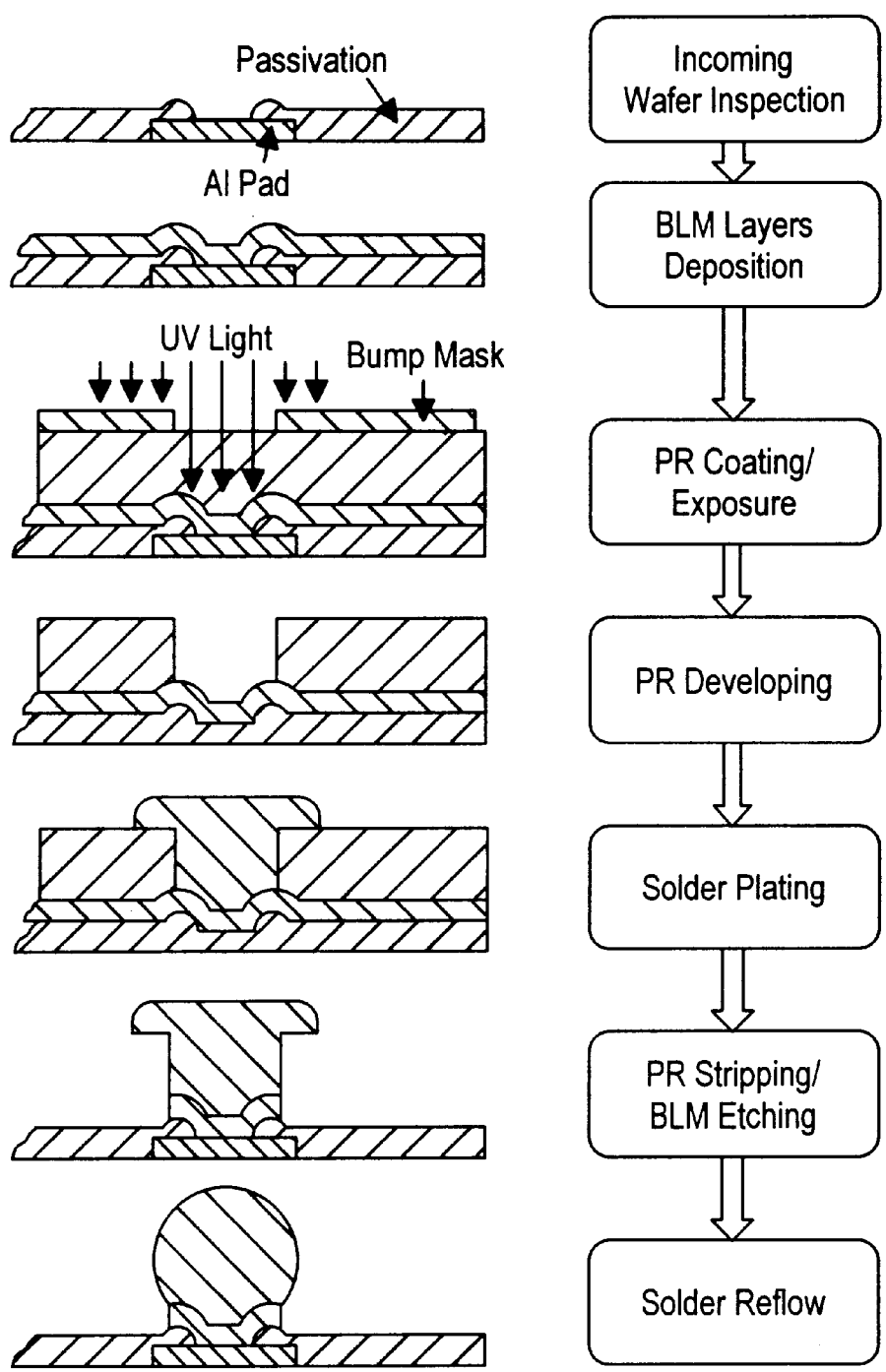
FIG. 2 is a graph illustrating a process flow chart and corresponding enlarged, cross-sectional views of a device having solder bumps deposited therein by an electroplating technique.
Figure 3:
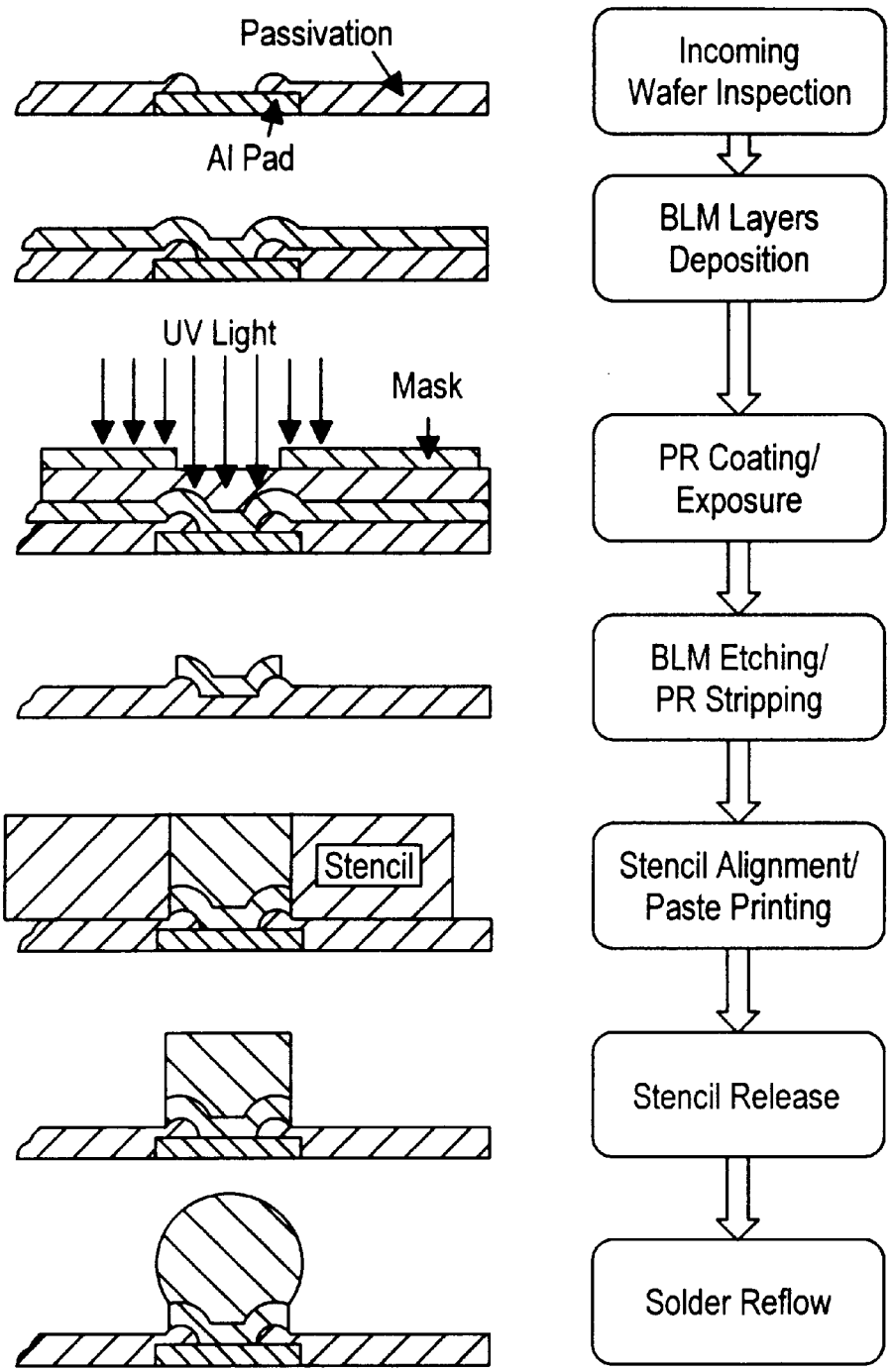
FIG. 3 is a graph illustrating a process flow chart and corresponding enlarged, cross-sectional views of a device having solder bumps deposited therein by a screen printing technique.
Figure 4:
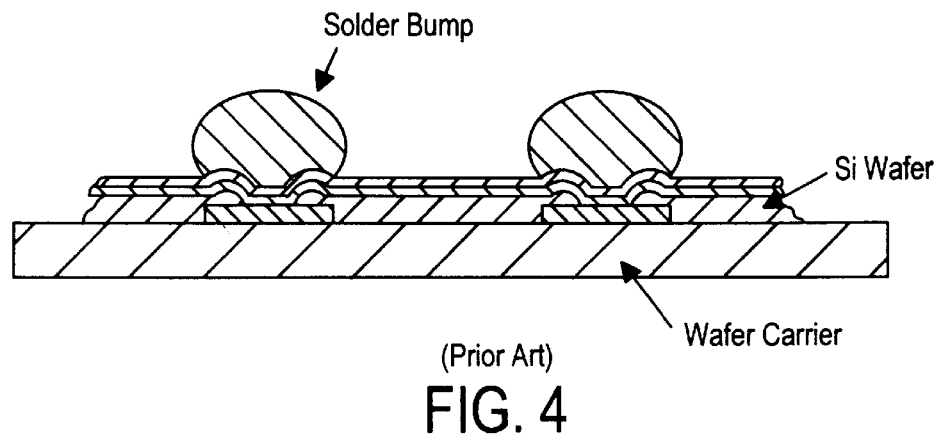
FIG. 4 is an enlarged, cross-sectional view of solder balls formed from solder bumps that were reflowed in an upward position.
Figure 5:
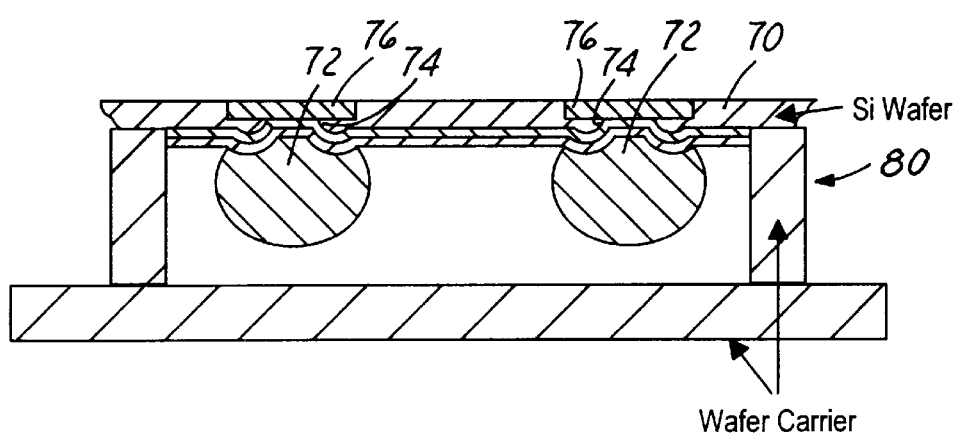
FIG. 5 is an enlarged, cross-sectional view of the present invention method utilizing a wafer carrier frame for reflowing solder bumps into solder balls placed in an upside down position.

After the solder bumps are deposited, the photoresist layer or the stencil may be removed from the surface of the substrate. At this time, the solder bumps are sent into a reflow furnace for shaping the solder balls from the solder bumps. A variety of furnaces may be used for such purpose while an inert gas such as nitrogen is normally used to fill the furnace and to achieve temperature uniformity inside the furnace. In the present invention novel method, as shown in FIG. 5, a silicon wafer 70 which has solder bumps 72 built thereon is positioned in an upside down position when placed in a reflow furnace. It should be noted that the solder bumps 72 are built on a BLM layer 74 and an aluminum bond pad 76. Various mechanical methods may be used to place the silicon wafer 70 in an upside down position. FIG. 5 merely suggests one of such method by using a wafer carrier frame 80. In a fabrication process, such as one conducted in a vertical furnace having a vertical cavity, a series of wafer carrier may be provided in a stacked configuration such that a plurality of silicon wafers 70 that has solder bumps built thereon may be inserted into the wafer carriers and be stacked up in the cavity for reflowing the solder bumps in an upside down position.

It is noted that by utilizing the present invention novel method, the height of the solder balls obtained after the reflow process is improved by at least 5%, and preferably by at least 10%. This is shown in Table 1. It is seen that during a run of 10 wafers, the average improvement in the height of the solder balls reflown by the present invention method is at least 10%. It should also be noted that not only the present invention method produces taller solder balls after reflow, the present invention novel method also produces solder balls that are more consistent in height, or have significantly smaller standard deviations. For instance, the standard deviations between the solder balls obtained is improved by at least 10% when the balls are reflown by the present invention novel method. The reflow process is normally conducted in a temperature range between about 150° C. and about 250° C. for a Pb/Sn based solder material which has a melting point of about 180° C. The Pb/Sn type solder material that is suitable for bumping a silicon wafer is normally provided in the range containing between about 37% and 97% Pb and between about 63% and 10% Sn. Obviously, the present invention novel method may be suitably used for any other solder compositions as long as gravity is a consideration during the reflow process of the solder bumps.

TABLE 1

Ball Height

| No. | Up | Down |
|---|---|---|
| 1 | 107 | 120 |
| 2 | 107 | 120 |
| 3 | 109 | 124 |
| 4 | 100 | 112 |
| 5 | 94 | 115 |
| 6 | 95 | 121 |
| 7 | 100 | 119 |
| 8 | 99 | 118 |
| 9 | 92 | 115 |
| 10 | 99 | 118 |
| Average ($\mu$m) | 100.2 | 118.2 |
| Standard Deviation ($\mu$m) | 5.83 | 3.46 |

The beneficial effect of the present invention novel method may further be seen in the following equation which is obtained from a Coffin-Manson low cycle fatigue model obtained on a simulated solder bump. The equation represents:

$$\overline{N}_f \propto \left( \frac{h}{L_c(\Delta\alpha)*(\Delta T)} \right)^2$$

Where $N_f$ is the median fatigue life in cycles, h is the solder joint height, $L_c$ is the effective IC half length, $\Delta\alpha$ is the coefficient of thermal expansion and $\Delta T$ is the temperature change in device. Data obtained in a computer simulation are presented in FIG. 6 for three cases of different effective IC half lengths, i.e., at 10 mm, 20 mm and 5 mm. It is clearly shown in FIG. 6 that, as the height of the solder joint is increased, the fatigue life is proportionally increased. The increase is most significant when the effective IC half length is smaller, i.e., at 5 mm.

Figure 6:
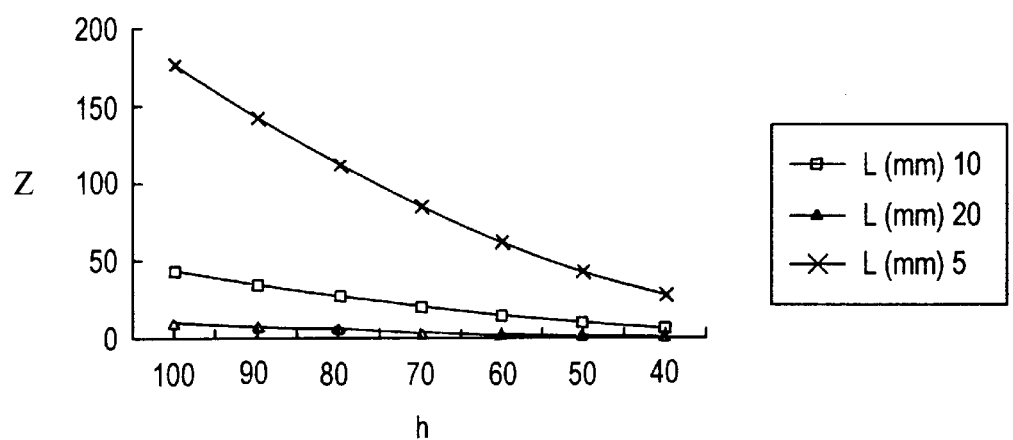
FIG. 6 is a graph illustrating the effect of the height of solder balls on the fatigue life of the balls on a flip-chip.

The present invention novel method and devices produced by the method have therefore been amply demonstrated in the above descriptions and in the appended drawings of FIGS. 5 and 6. It should be noted that while the present invention novel method has been demonstrated by a Pb/Sn based solder material, any other solder compositions may similarly utilize the present invention novel method to achieve similarly desirable results.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming solder balls of improved height on an electronic substrate comprising the steps of:
   providing an electronic substrate having a multiplicity of conductive pads on a top surface,
   patterning a photo mask overlying said substrate for providing a multiplicity of openings exposing said multiplicity of conductive pads,
   filling said multiplicity of openings with a solder material,
   removing said photo mask from said substrate forming said multiplicity of upwardly standing solder bumps on said top surface,
   turning said electronic substrate upside down such that said multiplicity of upwardly standing solder bumps point downwardly, and
   heating said multiplicity of solder bumps at a temperature at least the reflow temperature of said solder material for a sufficient length of time such that said solder bumps are reflown into solder balls having improved height caused by gravity when compared to solder balls that are not reflown in an upside down position.

2. A method for forming solder balls of improved height on an electronic substrate according to claim 1 further comprising the step of filling said multiplicity of openings with a solder material by a technique selected from the group consisting of evaporation, electroplating, electroless plating and screen printing.

3. A method for forming solder balls of improved height on an electronic substrate according to claim 1 further comprising the step of filling said multiplicity of openings with a solder material by a screen printing technique.

4. A method for forming solder balls of improved height on an electronic substrate according to claim 1 further comprising the step of filling said multiplicity of openings with a Pb/Sn solder material.

5. A method for forming solder balls of improved height on an electronic substrate according to claim 1 further comprising the step of filling said multiplicity of openings with a solder containing between about 37% and about 97% Pb and between about 3% and about 63% Sn.

6. A method for forming solder balls of improved height on an electronic substrate according to claim 1, wherein said electronic substrate is a silicon wafer.

7. A method for forming solder balls of improved height on an electronic substrate according to claim 1 further comprising the step of filling said multiplicity of openings with a solder material having a melting temperature of not less than 180° C.

8. A method for forming solder balls of improved height on an electronic substrate according to claim 1 further comprising the step of positioning said electronic substrate on a carrier such that said multiplicity of solder bumps are spaced apart from the carrier after said step of turning the electronic substrate upside down.

9. A method for forming solder balls of improved height on an electronic substrate according to claim 1, wherein said reflow temperature of the solder material is at least 150° C.

10. A method for forming solder balls of improved height on an electronic substrate according to claim 1, wherein said sufficient length of time for heating the multiplicity of solder bumps is at least one minute.

11. A method for forming solder balls of improved height on an electronic substrate according to claim 1, wherein a height of said solder balls after a reflow process is improved by at least 10%.

12. A method for forming solder balls of improved height on an electronic substrate according to claim 1, wherein said solder bumps of improved height are formed with an increase in the pitch by at least 5%.

13. A method for forming solder balls of improved height on an electronic substrate according to claim 1, wherein said solder bumps of improved height are formed on a flip chip.

14. A method for forming solder bumps of improved height on a flip chip comprising the steps of:
   providing a silicon substrate having a multiplicity of flip chips formed on top, each of said flip chips further comprising a multiplicity of conductive pads on a top surface,
   depositing a photo mask overlying said silicon wafer for providing a multiplicity of openings exposing said multiplicity of conductive pads, filling said multiplicity of openings with a solder material, removing said photo mask from said silicon wafer forming said multiplicity of upwardly standing solder bumps on said top surface, turning said silicon wafer upside down such that said multiplicity of upwardly standing solder bumps are pointed downwardly, and heating said multiplicity of solder bumps at a temperature at least of the reflow temperature of the solder material for a sufficient length of time such that the solder bumps are reflown into solder balls of a height that is improved by at least 10% when compared to solder balls that are reflown not in an upside down position.

15. A method for forming solder bumps of improved height on a flip chip according to claim 14 further comprising the step of filling said multiplicity of openings with a solder material by a technique selected from the group consisting of evaporation, electroplating, electroless plating and screen printing.

16. A method for forming solder bumps of improved height on a flip chip according to claim 14, wherein said solder material is a Pb/Sn based material.

17. A method for forming solder bumps of improved height on a flip chip according to claim 14 further comprising the step of turning said silicon wafer upside down and positioning said silicon wafer on a carrier frame such that said solder bumps are spaced apart from a bottom surface of said carrier frame.

18. A method for forming solder bumps of improved height on a flip chip according to claim 14 further comprising the step of heating said multiplicity of solder bumps at a reflow temperature of at least 150° C.

* * * * *